United States Patent
Zhen et al.

(10) Patent No.: US 6,993,286 B2
(45) Date of Patent: Jan. 31, 2006

(54) DUAL BAND BIDIRECTIONAL AMPLIFIER FOR WIRELESS COMMUNICATION

(75) Inventors: Liping Zhen, Corvallis, OR (US); David L. Wills, Albany, OR (US)

(73) Assignee: Radio Frequency Systems, Inc., Meriden, CT (US)

( * ) Notice: Subject to any disclaimer, the term of this patent is extended or adjusted under 35 U.S.C. 154(b) by 383 days.

(21) Appl. No.: 10/210,054

(22) Filed: Aug. 2, 2002

(65) Prior Publication Data

US 2004/0192194 A1   Sep. 30, 2004

(51) Int. Cl.
    *H04B 3/36*  (2006.01)
(52) U.S. Cl. .................. 455/7; 455/11.1; 455/12.1; 370/315; 370/316; 330/126; 330/295
(58) Field of Classification Search .............. 455/7, 455/11.1, 13.1, 14, 15, 16, 22, 12.1, 561; 370/277, 279, 315, 316; 330/124 R, 126, 330/295

See application file for complete search history.

(56) References Cited

U.S. PATENT DOCUMENTS

| | | | |
|---|---|---|---|
| 4,317,216 A | 2/1982 | Kaegebein | |
| 4,761,821 A | 8/1988 | Mawhinney et al. | |
| 4,764,979 A | 8/1988 | Noguchi et al. | |
| 4,849,963 A * | 7/1989 | Kawano et al. | 370/279 |
| 5,812,306 A | 9/1998 | Mizrahi | |
| 5,963,587 A | 10/1999 | Kumagai | |
| 6,005,884 A * | 12/1999 | Cook et al. | 375/132 |
| 6,125,266 A | 9/2000 | Matero et al. | |
| 6,195,561 B1 | 2/2001 | Rose | |
| 6,226,275 B1 | 5/2001 | Yang et al. | |
| 6,272,329 B1 | 8/2001 | Sawchuk | |
| 2003/0211828 A1 * | 11/2003 | Dalgleish et al. | 455/11.1 |

* cited by examiner

*Primary Examiner*—Nay Maung
*Assistant Examiner*—Raymond S. Dean
(74) *Attorney, Agent, or Firm*—Sughrue Mion, PLLC; V. Lawrence Sewell

(57) ABSTRACT

The dual band bi-directional amplifier has only one amplifier chain having an uplink amplifier and a downlink amplifier, but can nonetheless amplify signals from two frequency bands in both an uplink and a downlink direction between two antennas. This is possible by using duplexers and circulators to separate signals to and from each antenna into the two bands. In particular, for each frequency band handled by the circuit, the dual band bi-directional amplifier has a duplexer set for separating the signals from one of the bands into the uplink and downlink direction. In the case of a dual band amplifier, there are two sets of duplexers, one for each band. By using duplexers and circulators to differentiate signals in different bands travelling in different directions, there is no need for additional amplifier chains, which increase the manufacturing costs.

12 Claims, 2 Drawing Sheets

DUAL BAND BIDIRECTIONAL AMPLIFIER FOR WIRELESS COMMUNICATION

BACKGROUND OF THE INVENTION

The present invention is directed to amplifiers used in wireless communication systems. More specifically, the present invention relates to dual band bi-directional amplifiers for amplifying signals in two frequency bands having two uplink and two downlink frequencies.

In wireless communication systems, such as cellular telephony, bi-directional amplifiers are used to amplify signals passing in both directions between two parts of the system, such as the base station and the local service area. In the past, when the transmission signals were covered by one frequency band, a single band bi-directional amplifier having an uplink amplifier chain and a downlink amplifier chain was used to accomplish this purpose.

However, in more modern applications, bi-directional amplifiers are required to provide signal coverage in two frequency bands. Conventional dual band bi-directional amplifiers of this type have been constructed with two single-band bi-directional amplifiers connected to two power dividers. A conventional dual-band bi-directional amplifier of this type is shown in FIG. 1.

In particular, FIG. 1 shows a conventional dual-band bi-directional amplifier 100 constructed of two single-band bi-directional amplifiers 102 and 104 enclosed within the dashed boxes. Signals from the first frequency band are processed in the single-band bi-directional amplifier 102 and signals from the second frequency band are processed in the single-band bi-directional amplifier 104. Both bi-directional amplifiers 102 and 104 have the same construction.

Specifically, single-band bi-directional amplifier 102 includes uplink amplifier 110, a downlink amplifier 112, and two duplexers 114 and 116. Duplexers 114 and 116 separate the uplink and downlink frequency signals covered by the frequency band processed by the single-band bi-directional amplifier 102. Duplexer 114 passes the uplink frequency signal from a reception signal port 118 to the input of uplink amplifier 110. The output of uplink amplifier 110 is connected to the reception signal port 120 of the duplexer 116.

Likewise, duplexer 116 passes the downlink frequency signal from a transmit signal port 122 to the input of downlink amplifier 112. The output of downlink amplifier 112 is connected to the reception signal port 124 of the duplexer 114.

The single-band bi-directional amplifier 104 for the other of the two frequency bands has a similar structure.

In order to accomplish the dual-band function, the single-band bi-directional amplifiers discussed above are connected to power dividers 126 and 128 which in turn are respectively connected to antennae 130 and 132. The power dividers 126 and 128 pass the signals from the antenna into two signal paths, one for each of the two frequency bands, for the two single-band bi-directional amplifiers 102 and 104.

While this construction provides a simple solution for dual-band bi-directional signal amplification, it has a number of drawbacks. In particular, due to the power divider, the overall system gain is 6 dB lower, the output power is 3 dB lower, and noise figure is 3 dB higher. Therefore, the system sensitivity is 3 dB lower, compared to the single-band bi-directional amplifier. Furthermore, the cost of the system is greater than double the cost of a single-band bi-directional amplifier.

SUMMARY OF THE INVENTION

In view of the foregoing, the present invention provides a dual-band bi-directional amplifier for amplifying radio signals in a plurality of frequency bands. In one embodiment, the amplifier is connected between a first antenna and a second antenna and includes a single bi-directional amplifier chain for amplifying signals in a downlink direction from the first antenna to the second antenna and in an uplink direction from the second antenna to the first antenna. A first circulator is connected to the first antenna, and a second circulator is connected to the second antenna.

Two sets of duplexers are also provided. Each of the duplexers in these two duplexer sets separate signals for one of the two frequency bands into the uplink direction and the downlink direction, and output these signals on a plurality of ports corresponding to each of the uplink and downlink directions. One duplexer from the first set of duplexers and one duplexer from the second set of duplexers are connected to the first circulator, and other duplexer from the first set of duplexers and other duplexer from the second set of duplexers are connected to the second circulator.

The input of the bi-directional amplifier in the uplink direction is connected to the uplink ports of the first and second sets of duplexers through a T cable, and the output of the bi-directional amplifier in the uplink direction is connected to the uplink ports of the first and second sets of duplexers through another T cable.

In addition, the input of the bi-directional amplifier in the downlink direction is connected to the downlink ports of the first and second sets of duplexers and the output of the bi-directional amplifier in the downlink direction is connected to the downlink ports of the first and second sets of duplexers.

The invention is taught below by way of various specific exemplary embodiments explained in detail, and illustrated in the enclosed drawing figures.

BRIEF DESCRIPTION OF THE DRAWINGS

The drawing figures depict, in highly simplified schematic form, embodiments reflecting the principles of the invention. Many items and details that will be readily understood by one familiar with this field have been omitted so as to avoid obscuring the invention. In the drawings.

DETAILED DESCRIPTION OF THE INVENTION

The invention will now be taught using various exemplary embodiments. Although the embodiments are described in detail, it will be appreciated that the invention is not limited to just these embodiments, but has a scope that is significantly broader. The appended claims should be consulted to determine the true scope of the invention.

In order to overcome the problems with the conventional dual-band bi-directional amplifier design, the dual-band bi-directional amplifier of the present invention provides a unique design which improves the signal quality and RF response, and which can be constructed at a lower cost.

Figure 1:
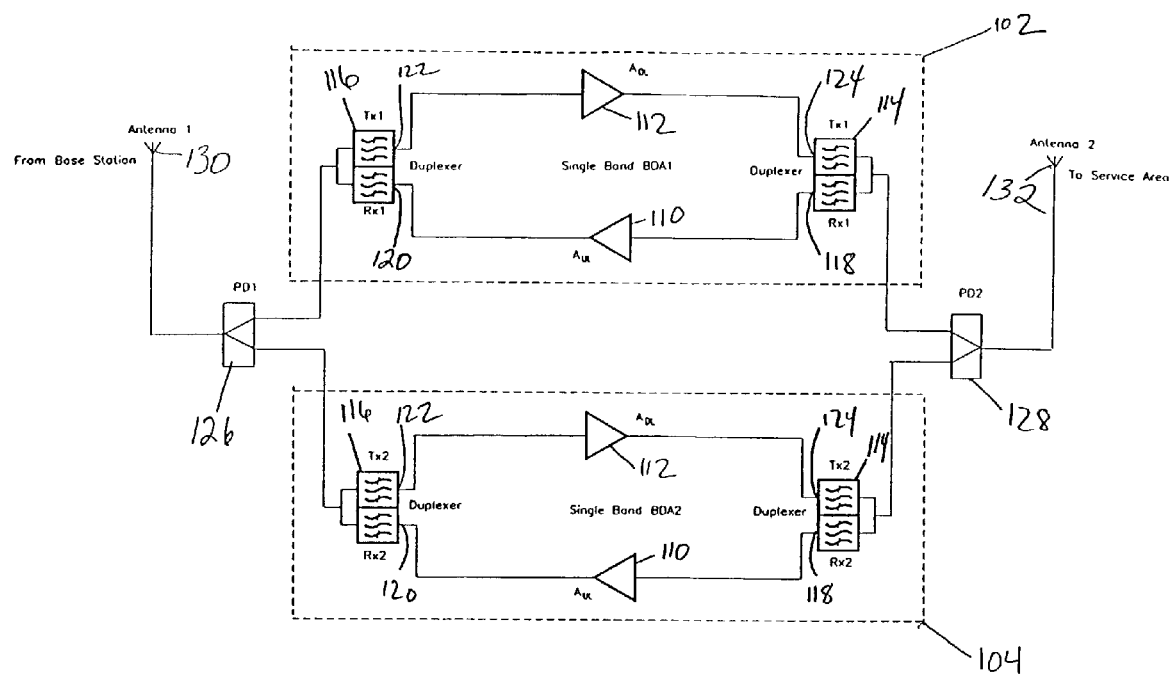
FIG. 1 is a schematic diagram of the conventional dual-band bi-directional amplifier.
Figure 2:
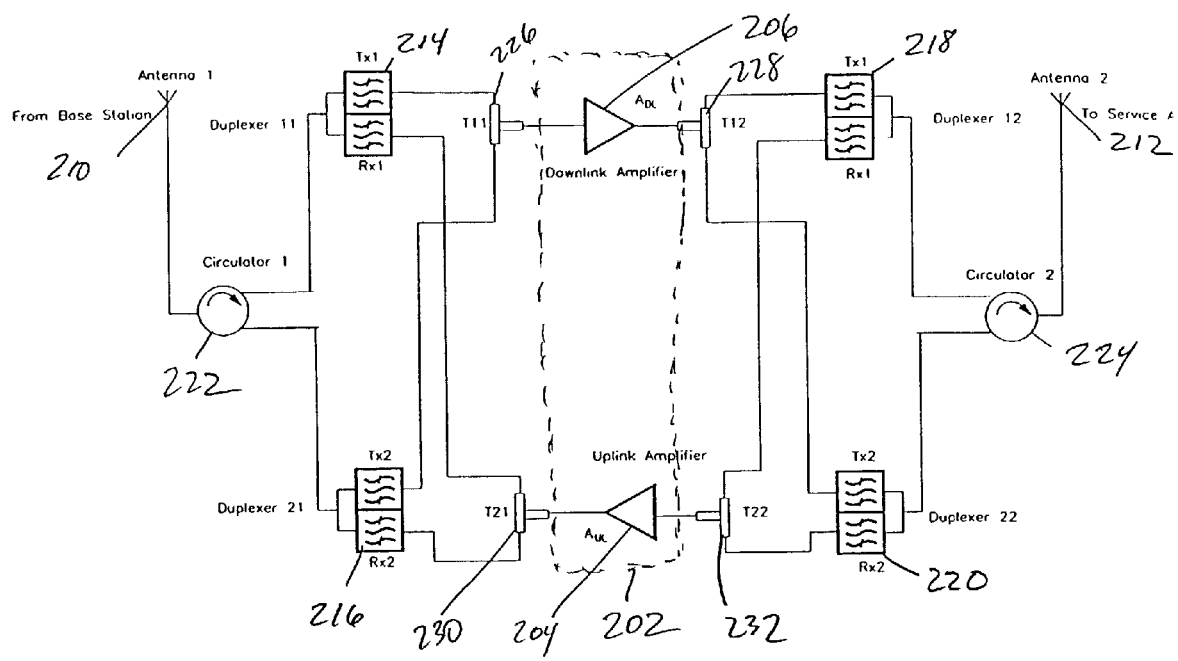
FIG. 2 is a schematic diagram of an embodiments of a dual-band bi-directional amplifier according to the present invention, showing the single bi-directional amplifier chain.

FIG. 2 shows one embodiment of the dual-band bi-directional amplifier system of the present invention in detail. The dual-band bi-directional amplifier 200 is capable of amplifying signals in a downlink direction from the first antenna 210 to the second antenna 212 and in an uplink direction from the second antenna 212 to the first antenna 210.

The system 200 includes two sets of duplexers, the first duplexer set having duplexers 214 and 218 for separating uplink signal Rx1 and downlink signal Tx1 in the first frequency band, and the second duplexer set having duplexers 216 and 220 for separating uplink signal Rx2 and downlink signal Tx2 in the second frequency band. All of the duplexers 214, 216, 218, and 220 have at least four ports corresponding to an input and an output for each of the downlink signals Tx and the uplink signals Rx.

Downlink signals Tx1 and Tx2 are received by antenna 210 and distributed to duplexers 214 and 216 via a circulator 222. The circulator has one port connected to the antenna for carrying the signals to and from the antenna, and two other ports connected to the duplexers, one port for each of the two frequency bands.

Downlink signals Tx1 and Tx2 are amplified by downlink amplifier 206 before passing through duplexers 218 and 220. In an embodiment, the downlink signals Tx1 and Tx2 pass through a T-cable 226, which are input to amplifier 206. Likewise, the output of amplifier 206 is passed through another T-cable 228 which separates the signals into two, one for each frequency band. It is understood that the function provided by the T-cable in this embodiment could be provided by other conventional devices as well, and the present invention is not limited to the use of T-cables.

The output of duplexers 218 and 220 are connected to circulator 224, so that downlink signals Tx1 and Tx2 are fed into circulator 224. The circulator combines the now-amplified downlink signals for each frequency band into a single output which is fed to antenna 212.

For signals in the reverse direction, the uplink direction from antenna 212 to antenna 210, the system 200 requires no additional duplexers or circulators from those required to amplify the downlink signals.

In particular, uplink signals, Rx1 and Rx2, are received at antenna 212, passed through circulator 224, and sent to duplexers 218 and 220. Duplexers 218 and 220 separate the uplink signals Rx1 and Rx2 and pass them to the uplink amplifier 204 via T-cable 232. The output of uplink amplifier 204 passes through T-cable 230, which separates the now-amplified signals back into separate signals Rx1 and Rx2 corresponding to the two frequency bands.

T-cable 230 passes signals Rx1 and Rx2 to duplexers 214 and 216. Rx1 passes through duplexer 214 while Rx2 passes through duplexer 216, respectively. Both uplink signals go through circulator 222 and are sent to antenna 210 for transmission.

Notably, the dual-band bi-directional amplifier 200 includes only a single bi-directional amplifier chain 202 having only one uplink amplifier 204 and one downlink amplifier 206. Because amplifier chains are one of the most expensive components of bi-directional amplifier systems, having only one amplifier chain greatly reduces the cost.

Because of the different impedances and other signal characteristics of the uplink and downlink signals, the same circulators and duplexers can operate on both signals in both directions at the same time. By taking advantage of this feature as shown in the arrangement of FIG. 2, a dual-band bi-directional amplifier can be constructed at a lower cost and with improved signal characteristics than a conventional one.

In particular, in the dual frequency bands of SMR 800 MHz and SMR 900 MHz, the dual-band bi-directional amplifier of the present invention is nearly 2 dB higher in output power than the conventional dual band bi-directional amplifier, with 2 dB improvement in system sensitivity, and a cost of roughly 30% less than the conventional dual-band bi-directional amplifier.

Many variations to the above-identified embodiments are possible without departing from the scope and spirit of the invention. Possible variations have been presented throughout the foregoing discussion.

Combinations and sub-combinations of the various embodiments described above will occur to those familiar with this field, without departing from the scope and spirit of the invention.

What is claimed is:

1. A dual-band bi-directional amplifier for amplifying radio signals in a plurality of frequency bands comprising:
   a bi-directional amplifier chain for amplifying signals in a downlink direction from a first antenna to a second antenna and in an uplink direction from said second antenna to said first antenna;
   a first circulator having a plurality of ports, one of said ports connected to the first antenna;
   a second circulator having a plurality of ports, one of said ports connected to the second antenna;
   a plurality of sets of duplexers, each of said duplexers separating signals for one of said plurality of frequency bands into the uplink direction and the downlink direction, said duplexers having a plurality of ports corresponding to each of the uplink and downlink directions, wherein a duplexer of the first set of said duplexers is connected to the first circulator, and another duplexer of the first set of said duplexers is connected to the second circulator, and wherein a duplexer of the second set of said duplexers is connected to the first circulator, and another duplexer of the second set of said duplexers is connected to the second circulator;
   the input of said bi-directional amplifier in the uplink direction being connected to uplink ports of the duplexers connected to the second circulator, and the output of said bi-directional amplifier in the uplink direction being connected to the uplink ports of the duplexers connected to the first circulator; and
   the input of said bi-directional amplifier in the downlink direction being connected to downlink ports of the duplexers connected to the first circulator, and the output of said bi-directional amplifier in the downlink direction being connected to the downlink ports of the duplexers connected to the second circulator.

2. The dual-band bi-directional amplifier of claim 1, further comprising one bi-directional amplifier chain.

3. The dual-band bi-directional amplifier of claim 1, wherein said bi-directional amplifier chain has one amplifier for the uplink direction and one amplifier for the downlink direction.

4. The dual-band bi-directional amplifier of claim 1, wherein the total number of duplexers is equal to twice the number of frequency bands in the system.

5. The dual-band bi-directional amplifier of claim 1, wherein the number of duplexers in each set of duplexers corresponds to the number of frequency bands in said plurality of frequency bands.

6. The dual-band bi-directional amplifier of claim 1, wherein said plurality of frequency bands comprises two frequency bands and each said set of duplexers comprises two duplexers.

7. The dual-band bi-directional amplifier of claim 1, wherein one of said ports corresponds to one of said frequency bands in said plurality of frequency bands.

8. The dual-band bi-directional amplifier of claim 1, wherein the inputs and outputs of the bi-directional amplifier chain are connected to the duplexers via T-cables.

9. The dual-band bi-directional amplifier of claim 1, wherein a first frequency band is the 800 MHz specialized mobile radio frequency band and the second frequency band is the 900 MHz specialized mobile radio frequency band.

10. A wireless communication system for sending and receiving radio signals in a plurality of frequency bands comprising:
- a dual band bi-directional amplifier system capable of receiving and transmitting radio frequency signals in a first of at least two frequency bands in a downlink direction from a first antenna to a second antenna and simultaneously receiving and transmitting in a second of the frequency bands in the downlink direction, and simultaneously receiving and transmitting in the first and second frequency bands in an uplink direction from said second antenna to said first antenna,
- wherein said dual band bi-directional amplifier system includes an amplifier chain having one up link amplifier and one downlink amplifier;
- wherein signals in a given direction in both first and second frequency bands pass through the same amplifier.

11. The wireless communication system of claim 10, further comprising at least two duplexer sets corresponding to the at least two frequency bands,
- wherein a first duplexer set has a duplexer connected to said first antenna, to an input of the downlink amplifier, and to an output of the uplink amplifier, and
- wherein a second duplexer set has a duplexer connected to said second antenna, to an input of the uplink amplifier, and to an output of the downlink amplifier.

12. The wireless communication system of claim 11, further comprising at least two circulators, wherein
- a first circulator is connected to the first antenna, to a duplexer of the first duplexer set, and to a duplexer of the second duplexer set, and
- a second circulator is connected to the second antenna, to another duplexer of the first duplexer set, and to another duplexer of the second duplexer set.

* * * * *